United States Patent
Proffitt

(10) Patent No.: US 9,106,191 B2
(45) Date of Patent: Aug. 11, 2015

(54) DIODE ENHANCED AMPLIFIER CIRCUITS AND METHODS THEREOF

(71) Applicant: Adaptive I/O Technologies, Inc., Newport News, VA (US)

(72) Inventor: James Proffitt, Newport News, VA (US)

(73) Assignee: Adaptive I/O Technologies, Inc., Newport News, VA (US)

( * ) Notice: Subject to any disclaimer, the term of this patent is extended or adjusted under 35 U.S.C. 154(b) by 71 days.

(21) Appl. No.: 13/870,671

(22) Filed: Apr. 25, 2013

(65) Prior Publication Data

US 2013/0293296 A1  Nov. 7, 2013

Related U.S. Application Data

(60) Provisional application No. 61/641,365, filed on May 2, 2012.

(51) Int. Cl.
*H03F 3/08* (2006.01)
*H03F 3/68* (2006.01)
*H03F 3/21* (2006.01)

(52) U.S. Cl.
CPC ............ *H03F 3/68* (2013.01); *H03F 3/087* (2013.01); *H03F 3/211* (2013.01); *H03F 3/08* (2013.01); *H03F 2203/21109* (2013.01); *Y10T 29/49117* (2015.01)

(58) Field of Classification Search
CPC .......... H03F 2203/45528; H03F 3/45475; H03F 3/68; H03F 1/00; H03F 1/342; H03F 2200/03; H03F 2200/165; H03F 2200/168; H03F 2200/171; H03F 2200/351; H03F 2200/408; H03F 2200/78; H03F 2200/91; H03F 3/45183; H03F 2203/45352; H03F 3/08; H03F 1/0205; H03F 1/22; H03F 1/223; H03F 1/301; H03F 1/302; H03F 3/04; H03F 3/087; H03F 3/193; H03F 3/347; H03F 3/45071; H03F 1/3205; H03F 1/34; H03F 2200/18; H03F 2200/261; H03F 2200/456; H03F 2203/45138; H03F 2203/45244; H03F 2203/45314; H03F 2203/45356; G11C 11/5642; G02B 6/0028; G05F 3/20
USPC ................... 330/59, 308; 250/214 A, 214 AG
See application file for complete search history.

(56) References Cited

U.S. PATENT DOCUMENTS

| | | | | |
|---|---|---|---|---|
| 4,096,382 A * | 6/1978 | Numata et al. | ............. | 250/214 A |
| 4,952,795 A * | 8/1990 | Gauthier et al. | ............ | 250/214 A |
| 5,008,524 A * | 4/1991 | Reutter et al. | ............. | 250/214 A |
| 5,455,705 A * | 10/1995 | Gusinov | ..................... | 250/214 A |
| 6,747,263 B1 | 6/2004 | Popov | | |
| 6,949,977 B2 * | 9/2005 | Macciocchi | ................ | 330/207 P |
| 7,514,665 B2 * | 4/2009 | Murao et al. | ................ | 250/214 A |
| 7,612,322 B2 * | 11/2009 | Lum et al. | .................. | 250/214 R |
| 8,772,699 B2 * | 7/2014 | Brown et al. | ................ | 250/214 A |
| 2007/0086791 A1* | 4/2007 | Noya et al. | .................... | 398/202 |

* cited by examiner

*Primary Examiner* — Khanh V Nguyen
(74) *Attorney, Agent, or Firm* — LeClairRyan, a Professional Corporation

(57) ABSTRACT

An enhanced amplifier circuit includes an amplifier having an input and an output and a current source. A diode is coupled between the current source and the input of the amplifier. The enhanced amplifier circuit may include a number of current sources with associated diodes and amplifiers. The diode prevents the amplifier from interacting with some undesired properties of the current source, such as capacitance and resistance, prevents current sources from interacting with one another, and allows for the use of intrinsic properties of the diode to modify the current source output signal, among other advantages.

28 Claims, 4 Drawing Sheets

DIODE ENHANCED AMPLIFIER CIRCUITS AND METHODS THEREOF

CROSS-REFERENCE TO RELATED APPLICATIONS

This application claims the benefit of U.S. Provisional Patent Application Ser. No. 61/641,365, filed May 2, 2012, which is hereby incorporated by reference in its entirety.

FIELD

This technology generally relates to improved electronic circuits and, more particularly to diode enhanced amplifier circuits and methods thereof.

BACKGROUND

Current sources, such as sensors, generally convert physical quantities to electrical signals for further processing by electronic circuits. To assist with this signal processing, signals from the current sources are often amplified prior to processing. Current sources are coupled to an amplifier directly, through a passive component, such as a resistor or capacitor, or through an active component, such as a transistor.

When current sources are coupled to other circuit elements in an application circuit, undesirable and non-ideal properties of the current sources, such as capacitance and resistance, are introduced into the application circuit. This is especially true of solid-state current sources such as photodetectors. Additionally, elements of the application circuit, such as interconnections and bias circuits needed to operate the current sources, may introduce additional undesirable and non-ideal properties. Further, undesirable signals, often in the form of undesirable amplitudes or frequencies, may be introduced by the current sources, the application circuit, or the application environment.

These undesirable and non-ideal properties and signals introduced by the current sources may degrade the amplifier performance and overall application circuit performance and impose additional requirements on the design of both the amplifier and the application circuit. This is especially true for application circuits sensitive to fast dynamic changes in current source signals.

Another problem with current sources occurs when output signals from several current sources are connected together prior to amplification by one or more amplifiers. The signal current may flow between the current sources, which reduces the amount of current delivered to the amplifier. This signal loss may degrade system performance. Additionally, undesirable and non-ideal properties of the current sources, such as capacitance and resistance, as described earlier, may accumulate with each additional current source and further degrade system performance.

A further problem with current sources occurs when a grid of current sources, typically in a resistor-coupled configuration, is used in position-sensitive applications where the resistor-coupled grid can exhibit a signal leakage effect. In the grid configuration, signal current should flow primarily along one row and one column in the grid. Signal leakage occurs when signal current that flows through adjacent coupling resistors into adjacent rows and columns. Signal leakage reduces the amount of current delivered to the desired row and column amplifiers, which degrades spatial uniformity and position resolution.

SUMMARY

An enhanced amplifier circuit includes an amplifier having an input and an output and a current source. A diode is coupled between the at least one current source and the input of the amplifier.

Another enhanced amplifier circuit includes an amplifier having an input and an output and a plurality of current sources and a plurality of diodes. Each of the plurality of diodes is coupled between at least one of the plurality of current sources and the input of the amplifier.

Yet another example of an enhanced amplifier circuit includes a plurality of amplifiers each having an input and an output, a plurality of current sources arranged in a grid and a plurality of diodes. Each of the plurality of diodes is coupled to at least one of the plurality of current sources and to the input of at least one of the plurality of amplifiers.

An exemplary method for providing a diode enhanced amplifier circuit includes providing an amplifier having an input and an output, a current source, and a diode. The diode is coupled between the at least one current source and the input of the amplifier.

Another exemplary method for providing a diode enhanced amplifier circuit includes providing an amplifier having an input and an output, a plurality of current sources, and a plurality of diodes. Each of the plurality of diodes is coupled to at least one of the plurality of current sources and to the input of the amplifier.

Yet another exemplary method for providing a diode enhanced amplifier circuit includes providing a plurality of amplifiers each having an input and an output, a plurality of current sources arranged in a grid, and a plurality of diodes. Each of the plurality of diodes is coupled to at least one of the plurality of current sources and the input of at least one of the plurality of amplifiers.

This technology provides a number of advantages including providing more effective enhanced amplifier circuits and methods of manufacture. With this technology, the amplifier is prevented from interacting with undesired properties of the current source, such as capacitance and resistance. Further, with this technology the intrinsic properties of the diode are used to modify the current source output signal. The benefits of this technology may be further applied to groups of current sources connected to a single amplifier, as well as a grid of current sources with row and column amplifiers. With this technology current sources in a multi-current source amplifier circuit are prevented from interacting with each other. The technology also reduces performance degradation and simplifies the application circuit and amplifier design process.

DETAILED DESCRIPTION

Figure 1:
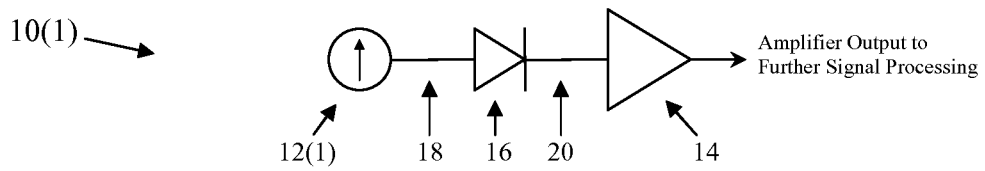
FIG. 1 is a circuit diagram of an exemplary enhanced amplifier circuit.

An exemplary enhanced amplifier circuit 10(1) is illustrated in FIG. 1. In this particular example, the enhanced amplifier circuit 10(1) includes a current source 12(1) connected to an amplifier 14 through a diode 16, although the enhanced amplifier circuit could include other types and numbers of systems, devices, components, and/or other elements in other configurations. This technology provides a number of advantages including providing more effective enhanced amplifier circuits and methods of manufacture.

Referring more specifically to FIG. 1, the current source 12(1) is located in enhanced amplifier circuit 10(1), although other types and numbers of sources could be used, such as a voltage or charge source by way of example only. Current source 12(1) further refers to all circuit components coupled to the terminal of the diode 16, such as a bias control by way of example only. Additionally, by way of example only, the current source 12(1) may be a sensor or detector that converts a physical quantity, such as light, into an electrical current. Particular sensors that may benefit from this technique include high-capacitance current sources and photodetectors such as photodiodes and silicon photomultipliers, although this technology may be used with other types of sensors or current sources.

The amplifier 14 may be any device for increasing the power of the received signal from the current source 12(1), or converting the current signal from the current source 12(1) into a voltage. The amplifier 14 refers to all circuit elements connected to the other terminal of the diode 16. By way of example only, the amplifier 14 may be a current-to-voltage converter, such as a transimpedance amplifier, although other types of amplifiers, such as inverting or non-inverting amplifiers may be used.

The diode 16 may be any type of diode known in the art suitable for providing the functions described herein, although other types and numbers of devices or other components could be used, such as a transistor. The diode 16 may further be selected for certain properties intrinsic to diodes, such as capacitance, inductance, and nonlinear resistance, although the selected diode 16 may have other intrinsic properties.

The diode 16 is coupled between the current source 12(1) and the input to the amplifier 14, although other types and numbers of systems, devices, components, and/or other elements in other configurations could be used. In this particular example, the output of current source 12(1) is coupled to an anode 18 of the diode 16 and the input of the amplifier 14 is coupled to a cathode 20 of the diode 16, although diode 16 may also have a reverse orientation such that the output of the current source 12(1) is connected to the cathode 20 and the input of the amplifier 14 is connected to the anode 18.

An exemplary operation of the enhanced amplifier circuit 10(1) will now be described. In this example, the current source 12(1) produces a signal or current flow, although in other embodiments the current source 12(1) may produce a voltage. By way of example only, current source 12(1) produces the signal or current flow based on the conversion of a physical quantity, such as light, into an electrical current, although the current source 12(1) may produce the current in other ways. The signal or current flow from the current source 12(1) is then directed toward the amplifier 14 through the diode 16.

In this example, the diode 16 is oriented to allow normal current flow from the current source 12(1) to the amplifier 14 while blocking current flow from the amplifier 14 to the current source 12(1). Diode 16 has low forward resistance to allow normal sensor current flow from the current source 12(1) to the amplifier 14 and high reverse resistance to block current flow from the amplifier 14 to the current source 12(1). This orientation of the diode 16 prevents the amplifier 14 from interacting with the current source 12(1) which improves the dynamic response of the amplifier 14 and simplifies the design of amplifier 14. If the normal current source 12(1) signal current flow is reverse then the diode 16 orientation would be reversed.

The diode 16 may also serve to alter or condition the signal from the associated current source 12(1) prior to the signal being directed to the amplifier 14 in a desired manner dependent on the particular application. The diode 16 may alter the signal from the current source 12(1) through properties intrinsic to the particular diode 16 selected, such as capacitance, inductance, and nonlinear resistance. By way of example only, the diode 16 may be selected with certain nonlinear characteristics that cause the enhanced amplifier circuit 10(1) to attenuate low-amplitude components of the signal from the current source 12(1) without attenuating high-amplitude signals, similar to an amplitude threshold filter. As a further example, diode 16 of a specific material may be selected for specific values of capacitance, inductance, and resistance to cause the enhanced amplifier circuit 10(1) to transmit or attenuate certain frequencies contained in the signal from the current source 12(1). While examples of the selection of diode 16 for certain intrinsic characteristics have been described, the examples are to be understood as non-limiting and non-exhaustive and any other types of diode 16 with intrinsic characteristics known in the art may be selected depending on the properties required for the particular application.

The signal is then delivered from the current source 12(1) to the amplifier 14 which increases the strength of the signal. In one example, the amplifier 14 is a transimpedance amplifier which converts the signal from a current to a voltage, although other types of amplifiers may be utilized. The signal is increased by the amplifier 14 and is output for further signal processing.

Figure 2:
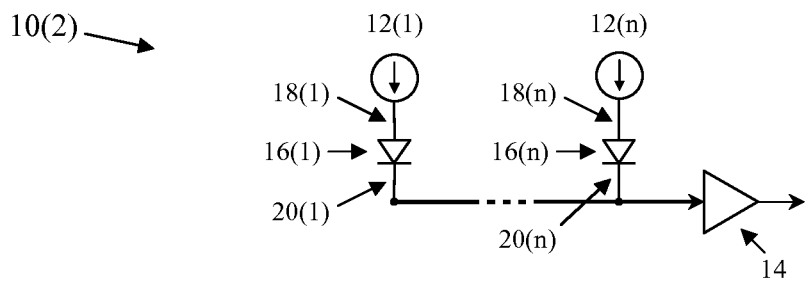
FIG. 2 is a circuit diagram of another exemplary enhanced amplifier circuit with a plurality of current sources and a plurality of diodes.

Referring to FIG. 2, another exemplary enhanced amplifier circuit is illustrated. In this example, enhanced amplifier circuit 10(2) includes two or more current sources 12(1)-12(n) arranged in a group such that each current source 12(1)-12(n) in the group is connected to the group amplifier 14 through a separate associated one of the diodes 16(1)-16(n), although the enhanced amplifier circuit 10(2) could include other types and numbers of devices, components, and other elements in other configurations.

In one example, each of the diodes 16(1)-16(n) is oriented such that the output of the associated current source 12(1)-12(n) is coupled to an anode 18(1)-18(n) of the diode 16 and the input of the amplifier 14 is coupled to a cathode 20(1)-20(n) of each of the diodes 16(1)-16(n), although one or more of the diodes 16(1)-16(n) also may have a reverse orientation such that the output of each the current sources 12(1)-12(n) is connected to the cathode 20(1)-20(n) and the input of the amplifier 14 is connected to the anode 18(1)-18(n).

An exemplary operation of the enhanced amplifier circuit 10(2) will now be described. In this example, the current sources 12(1)-12(n) each produce a signal or current flow, although in other embodiments the current source 12(1)-12(n) may produce a voltage. In one embodiment, current sources 12(1)-12(n) produce the signal or current flow based on the conversion of a physical quantity, such as light, into an electrical current, although the current sources 12(1)-12(n) may produce the signal in other ways. The signal or current flow from the current sources 12(1)-12(n) is then directed toward the group amplifier 14 through the one or more diodes 16(1)-16(n).

In this example, the one or more diodes 16(1)-16(n) are oriented to allow normal current flow from the current sources 12(1)-12(n) to the group amplifier 14 while blocking current flow from the amplifier 14 to the current sources 12(1)-12(n) as well as current flow between the individual current sources 12(1)-12(n).

Diodes 16(1)-16(n) have low forward resistance to allow normal sensor current flow from each of the current sources 12(1)-12(n) to the group amplifier 14 and high reverse resistance to block current flow from the amplifier 14 to each of the individual current sources 12(1)-12(n). This orientation of the diodes 16(1)-16(n) prevents the amplifier 14 from interacting with any of the current sources 12(1)-12(n) which improves the dynamic response of the group amplifier 14 and simplifies the design of group amplifier 14. If the normal signal current flow of the current sources 12(1)-12(n) is reverse then the orientation of the associated diodes 16(1)-16(n) would be reversed.

The diodes 16(1)-16(n) may also serve to alter or condition the signal from the associated current sources 12(1)-12(n) in a desired manner dependent on the particular application. The diodes 16(1)-16(n) may alter the signal from the current sources 12(1)-12(n) through properties intrinsic to the particular diode 16(1)-16(n) selected, such as capacitance, inductance, and nonlinear resistance. By way of example only, each of the diodes 16(1)-16(n) may be selected with certain nonlinear characteristics that cause the amplifier circuit to attenuate low-amplitude components of the signal from the current sources 12(1)-12(n) without attenuating high-amplitude signals, similar to an amplitude threshold filter. As a further example, diodes 16(1)-16(n) of a specific material may be selected for specific values of capacitance, inductance, and resistance to cause the amplifier circuit to transmit or attenuate certain frequencies contained in the signal from the current sources 12(1)-12(n). While examples of the selection of diodes 16(1)-16(n) for certain intrinsic characteristics have been described, the examples are to be understood as non-limiting and non-exhaustive and any other types of diodes 16(1)-16(n) with intrinsic characteristics known in the art may be selected depending on the properties required for the particular application.

The signal is then delivered from each of the current sources 12(1)-12(n) to the group amplifier 14 which increases the strength of the signal. In one example, the group amplifier 14 is a transimpedance amplifier which converts the signal from a current to a voltage, although other types of amplifiers may be utilized. The signal is increased by the group amplifier 14 and is output for further signal processing.

In the enhanced amplifier circuit 10(2), each current source 12(1)-12(n) and associated diode 16(1)-16(n) provides the advantages of the embodiment shown in FIG. 1. Diodes 16(1)-16(n) also block current flow between the current sources 12(1)-12(n) which increase the amount of current delivered to the group amplifier 14. Diodes 16(1)-16(n) further prevent some non-ideal properties of the current sources 12(1)-12(n), such as capacitance and resistance, from accumulating which improves dynamic response of the group amplifier 14.

Figure 3:
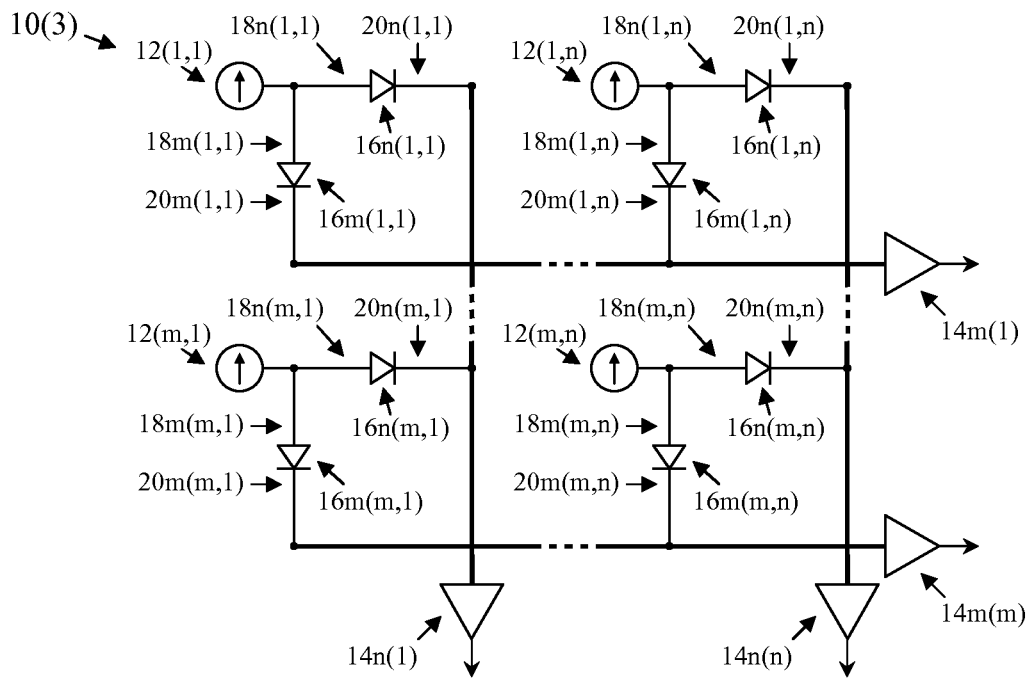
FIG. 3 is a circuit diagram of another exemplary enhanced amplifier circuit with a plurality of current sources and a plurality of diodes arranged in a grid pattern.

Referring to FIG. 3, another exemplary enhanced amplifier circuit 10(3) is illustrated. The exemplary enhanced amplifier circuit 10(3) includes a plurality of current sources 12(1,1)-12(m,n) arranged in a grid with rows (m) and columns (n). Each row in the grid is associated with a row amplifier 14m(1)-14m(m) and each column in the grid is associated with a column amplifier 14n(1)-14n(n). Each current source 12(1,1)-12(m,n) is coupled to the row amplifier 14m(1)-14m(m) by a row diode 16m(1,1)-16m(m,n). Each current source 12(1,1)-12(m,n) is coupled to the column amplifier 14n(1)-14n(n) by a column diode 16n(1,1)-16n(m,n).

Exemplary enhanced amplifier circuit 10(3) may include other types and numbers of devices, components, and other elements in other configurations.

In one example, each of the row diodes 16m(1,1)-16m(m,n) is oriented such that the output of the associated current source 12(1,1)-12(m,n) is coupled to an anode 18m(1,1)-18m(m,n) of the row diode 16m(1,1)-16m(m,n) and the input of the row amplifier 14m(1,1)-14m(m,n) is coupled to a cathode 20m(1,1)-20m(m,n) of each of the row diodes 16m(1,1)-16m(m,n). Further, in this example each of the column diodes 16n(1,1)-16n(m,n) is oriented such that the output of the associated current source 12(1,1)-12(m,n) is coupled to an anode 18n(1,1)-18n(m,n) of the column diode 16n(1,1)-16n(m,n) and the input of the column amplifier 14n(1,1)-14n(m,n) is coupled to a cathode 20n(1,1)-20n(m,n) of each of the column diodes 16n(1,1)-16n(m,n). Although one example has been described, it is to be understood that each of the row diodes 16m(1,1)-16m(m,n) and column diodes 16n(1,1)-16n(m,n) may have a reverse orientation.

An exemplary operation of the enhanced amplifier circuit 10(3) will now be described. In this example, the current sources 12(1,1)-12(1,n) each produce a signal or current flow, although in other embodiments the current source 12(1) may produce a voltage. In one embodiment, current sources 12(1,1)-12(1,n) produce the signal or current flow based on the conversion of a physical quantity, such as light, into an electrical current, although the current sources 12(1,1)-12(m,n) may produce the current or signal in other ways. The signal or current flow from each of the current sources 12(1,1)-12(1,n) is then directed toward a row amplifier 14m(1)-14m(m) and a column amplifier 14n(1)-14n(n) through a row diode 16m(1,1)-16m(m,n) and a column diode 16n(1,1)-16n(m,n) respectively.

In this example, the one or more row diodes 16m(1,1)-16m(m,n) are oriented to allow normal current flow from the current sources 12(1,1)-12(m,n) to one of the row amplifiers 14m(1)-14m(m) while blocking current flow from the row amplifier 14m(1)-14m(m) to the current sources 12(1,1)-12(m,n) as well as current flow between the individual current sources 12(1,1)-12(m,n) along the particular row. The one or more column diodes 16n(1,1)-16n(m,n) are oriented to allow normal current flow from the current sources 12(1,1)-12(m,n) to one of the column amplifiers 14n(1)-14n(n) while blocking current flow from the column amplifier 14n(1)-14n(n) to the current sources 12(1,1)-12(m,n) as well as current flow between the individual current sources 12(1,1)-12(m,n) along the particular column.

The row and column diodes 16m(1,1)-16m(m,n) and 16n(1,1)-16n(m,n) may also serve to alter or condition the signal from the associated current sources 12(1,1)-12(m,n) in a desired manner dependent on the particular application. The row and column diodes $16m(1,1)$-$16m(m,n)$ and $16n(1,1)$-$16n(m,n)$ may alter the signal from the current sources $12(1,1)$-$12(m,n)$ through properties intrinsic to the particular diode selected, such as capacitance, inductance, and nonlinear resistance. By way of example only, each of the row and column diodes $16m(1,1)$-$16m(m,n)$ and $16n(1,1)$-$16n(m,n)$ may be selected with certain nonlinear characteristics that cause the amplifier circuit to attenuate low-amplitude components of the signal from the current sources $12(1,1)$-$12(m,n)$ without attenuating high-amplitude signals, similar to an amplitude threshold filter.

As a further example, row and column diodes $16m(1,1)$-$16m(m,n)$ and $16n(1,1)$-$16n(m,n)$ of a specific material may be selected for specific values of capacitance, inductance, and resistance to cause the amplifier circuit to transmit or attenuate certain frequencies contained in the signal from the current sources $12(1,1)$-$12(m,n)$. While examples of the selection of row and column diodes $16m(1,1)$-$16m(m,n)$ and $16n(1,1)$-$16n(m,n)$ for certain intrinsic characteristics have been described, the examples are to be understood as non-limiting and non-exhaustive and any other types of row and column diodes $16m(1,1)$-$16m(m,n)$ and $16n(1,1)$-$16n(m,n)$ with intrinsic characteristics known in the art may be selected depending on the properties required for the particular application.

The signal from each of the current sources $12(1,1)$-$12(m,n)$ is then delivered to both an associated row amplifier $14m(1)$-$14m(m)$ and an associated column amplifier $14n(1)$-$14n(n)$ which increases the strength of the signal. In one example, the row amplifiers $14m(1)$-$14m(m)$ and column amplifiers $14n(1)$-$14n(n)$ are transimpedance amplifiers which converts the signal from a current to a voltage, although other types of amplifiers may be utilized. The signal is increased by each of the row amplifiers $14m(1)$-$14m(m)$ and column amplifiers $14n(1)$-$14n(n)$ and is output for further signal processing.

With further reference to the enhanced amplifier circuit $10(3)$, each row and column has the advantages of a group of current sources with one amplifier of the embodiment shown in FIG. 2. Diodes also block any current flow from leaking into additional rows and columns. For position-sensitive applications such as imaging, this improves spatial image uniformity and position resolution.

Figure 4:
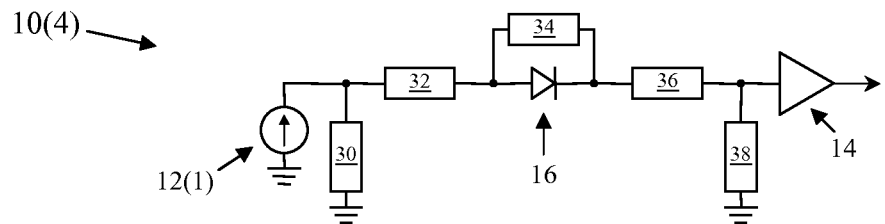
FIG. 4 is a circuit diagram of another exemplary enhanced amplifier circuit with additional active and/or passive components.

Referring to FIG. 4, another exemplary enhanced amplifier circuit $10(4)$ is illustrated. The exemplary enhanced amplifier circuit $10(4)$ includes a current source $12(1)$, an amplifier $14$, a diode $16$, and supplementary components $30$, $32$, $34$, $36$, and $38$. The supplementary components $30$, $32$, $34$, $36$, and $38$ may be active and/or passive components, such as capacitors, inductors, resistors, transistors, or switches, voltage sources or current sources, although other supplementary circuit components may be utilized in the enhanced amplifier circuit $10(4)$. The supplementary components $30$, $32$, $34$, $36$, and $38$ may be located in series or in parallel with the diode $16$. Examples of supplementary components along with their exemplary operation are described below. Each example may include one or more of the supplementary components $30$, $32$, $34$, $36$, and $38$. It is to be understood that these examples are non-exhaustive and non-limiting and any other supplementary components in other combinations may be used to achieve other operations for the electronic circuit $10(4)$. It is to be understood that each of the supplementary components $30$, $32$, $34$, $36$, and $38$ could also be applied to a group of current sources in order to provide the same associated benefits. The operation of the examples discussed below is the same as described with respect to exemplary enhanced amplifier circuit $10(1)$ except as described below.

EXAMPLE 1

In one example, supplementary component $30$ is a resistor placed between the current source $12(1)$ and its return path. The resistor $30$ selectively bypasses a specific amount of current from the current source $12$ prior to amplification in order to equalize sensor gain variations.

EXAMPLE 2

In another example, supplementary components $32$ and $36$ are resistors in series with the diode $16$. Resistors $32$ and $36$ selectively modify the amplifier gain for the current source $12(1)$ in order to equalize sensor gain variations.

EXAMPLE 3

In another example, supplementary component $32$ and $36$ are capacitors in series with the diode $16$. Capacitors $32$ and $36$ AC couple the current source $12(1)$ to the amplifier $14$.

EXAMPLE 4

In another example, supplementary components $30$ and $38$ are switches or transistors used to selectively discharge the current source $12(1)$.

EXAMPLE 5

In another example, supplementary components $32$ and $36$ are switches or transistors in series with the diode $16$. The switches or transistors $32$ and $36$ may be used to selectively connect or disconnect the current source $12(1)$ from the amplifier $14$.

EXAMPLE 6

In another example, supplementary component $34$ is a switch or transistor installed in parallel with the diode $16$. Switch $34$ may be used to selectively bypass the diode $16$.

EXAMPLE 7

In another example, supplementary components $30$, $32$, $34$, $36$, and $38$ may provide an external voltage or current signal that may be applied to the circuit $10(4)$ in order to change the operation of the diode $16$, or to change the operation of the current source $12(1)$ in conjunction with the diode $16$. By way of example, the external voltage or current signal may modify, statically or dynamically, the operating point of the diode $16$ or the operating point of the current source $12(1)$ through the diode $16$.

Although the addition of supplemental active or passive components at various locations has been described with respect to electronic circuit $10(4)$, it is to be understood that the embodiments in FIGS. 1-3 also may be optionally supplemented by additional active or passive components, voltage sources or current sources, in series or in parallel with the diodes $16$ as required by the particular application. In any of the embodiments in FIGS. 1-3, the diode $16$, amplifier $14$, and supplementary components $30$, $32$, $34$, $36$, and $38$ displayed in FIG. 4 may be implemented using discrete components or incorporated into an integrated circuit, such as an Application Specific Integrated Circuit (ASIC), although other types of integrated circuits may be used.

Figure 5A:
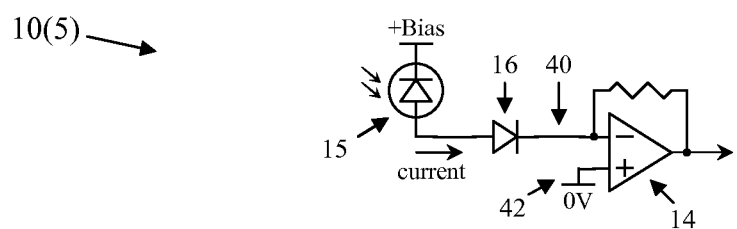
FIG. 5A is a circuit diagram of an exemplary enhanced amplifier circuit with a photodetector and diode in a forward orientation.
Figure 5B:
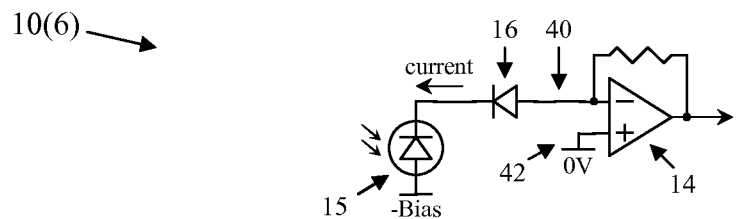
FIG. 5B is a circuit diagram of an exemplary enhanced amplifier circuit with a photodetector and diode in a reverse orientation.

Referring to FIGS. 5A and 5B, exemplary enhanced amplifier circuits 10(5) and 10(6) with a current source 15 which is a photodetector in forward and reverse orientation are illustrated, respectively. In this example, current source 15 is a photodetector, which operates as a current source, and amplifier 14 is a transimpedance amplifier, although other types of current sources and amplifiers may be utilized. In these examples, amplifier includes a negative terminal 40 and a positive terminal 42.

An exemplary operation of the enhanced amplifier circuits 10(5) and 10(6) will now be described. The operation of the enhanced amplifier circuits is the same as described with respect to exemplary enhanced amplifier circuit 10(1) except as described below. In the example shown in FIG. 5A, photodetector current flows from the photodetector 15 to the amplifier 14, while in the example shown in FIG. 5B, photodetector current flows from the amplifier 14 to the photodetector 15. In both examples, if the photodetector current is high, the forward resistance of the diode 16 is low and the amplifier circuit behaves like an ideal transimpedance amplifier. If the photodetector current is low, the forward resistance of the diode 16 increases and the amplifier circuit behaves like an attenuating inverting amplifier with an input impedance determined by the nonlinear forward resistance of the diode 16. Operation of the photodetector 15 and the diode 16 may be changed by applying a voltage to the positive amplifier terminal 42 which is illustrated in FIGS. 5A and 5B at zero volts. The amplifier feedback circuit will force the negative terminal voltage, connected to the diode 16, to follow the positive terminal voltage. This technique may be used, by way of example only, to change the bias of the photodetector 15.

Although the examples illustrated in FIGS. 5A and 5B are described with respect to an individual current source 15 (photodetector), the forward and reverse orientation examples in FIGS. 5A and 5B may be applied to group current sources, a grid of current sources, or any other configuration of current sources and is not limiting. The circuit may further include additional active and passive elements, or additional voltage sources or current sources.

Figure 6A:
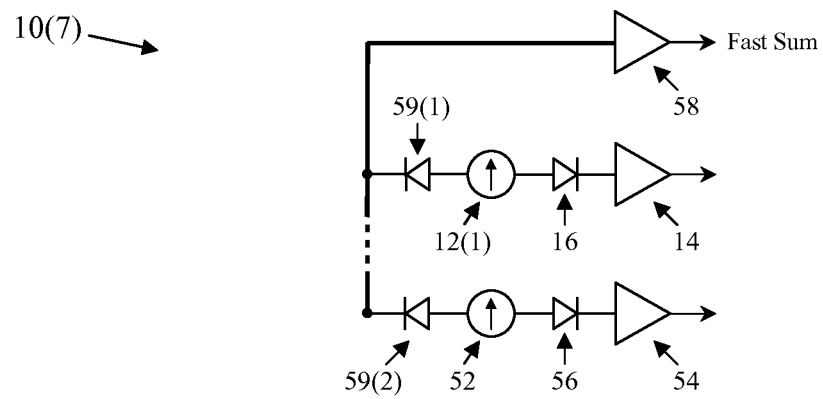
FIG. 6A is a circuit diagram of an exemplary enhanced amplifier circuit with a dedicated fast-sum signal path.

Referring to FIG. 6A exemplary enhanced amplifier circuit 10(7) includes amplifier 14 coupled to current source 12(1) through diode 16. In this example, enhanced amplifier circuit 10(7) also includes a second current source 52 coupled to amplifier 54 through diode 56. Current source 52 further refers to all circuit components coupled to the terminal of the diode 56, such as a bias control by way of example only. Additionally, by way of example only, the current source 52 may be a sensor or detector that converts a physical quantity, such as light, into an electrical current.

The amplifier 54 may be any device for increasing the power of the received signal from the current source 52, or converting the current signal from the current source 52 into a voltage. The amplifier 54 refers to all circuit elements connected to the other terminal of the diode 56. By way of example only, the amplifier 54 may be a current-to-voltage converter, such as a transimpedance amplifier, although other types of amplifiers, such as inverting or non-inverting amplifiers may be used.

The diode 56 may be any type of diode known in the art suitable for providing the functions described herein, although other types and numbers of devices or other components could be used, such as a transistor. The diode 56 may further be selected for certain properties intrinsic to diodes, such as capacitance, inductance, and nonlinear resistance, although the selected diode 56 may have other intrinsic properties.

Enhanced amplifier circuit 10(7) further includes an amplifier 58. In this example, amplifier 58 is a fast current amplifier, although other types of amplifiers may be utilized. Current sources 12(1) and 52 are coupled to the amplifier 58 through diodes 59(1) and 59(2), respectively, along a dedicated fast signal path. Diodes 59(1) and 59(2) may be any type of diodes known in the art suitable for providing the functions described herein, although other types and numbers of devices or other components could be used, such as a transistor. The diodes 59(1) and 59(2) may further be selected for certain properties intrinsic to diodes, such as capacitance, inductance, and nonlinear resistance, although the selected diodes may have other intrinsic properties. Although two current sources are illustrated coupled to amplifier 58, it is to be understood that the enhanced amplifier circuit could include additional current sources coupled to the amplifier 58 along the dedicated fast signal path.

An exemplary operation of the enhanced amplifier circuit 10(7) will now be described. The operation of current sources 12(1) and 52 coupled to amplifiers 14 and 54 is the same as described with respect to exemplary enhanced amplifier circuit 10(1) except as described below. Current sources 12(1) and 52 produce a fast-sum signal. The fast-sum signal may originate from a fast-timing connection to a standard current source terminal of current sources 12(1) and 52, although the fast-sum signal may also originate from a dedicated fast-timing current source terminal. The fast-sum signal or current flow from the current sources 12(1) and 52 is then directed toward the amplifier 58 through the diodes 59(1) and 59(2), respectively. Diodes 59(1) and 59(2) provide the same operation as described with respect to the diodes of the other exemplary circuits described herein.

The fast-sum signal is then delivered from each of the current sources 12(1) and 52 to the amplifier 58 which increases the strength of the signal. The signal from amplifier 58 is output for further signal processing. In one example, the fast-sum signal can be used to provide a fast system trigger, although the fast-sum signal may have other applications.

Figure 6B:
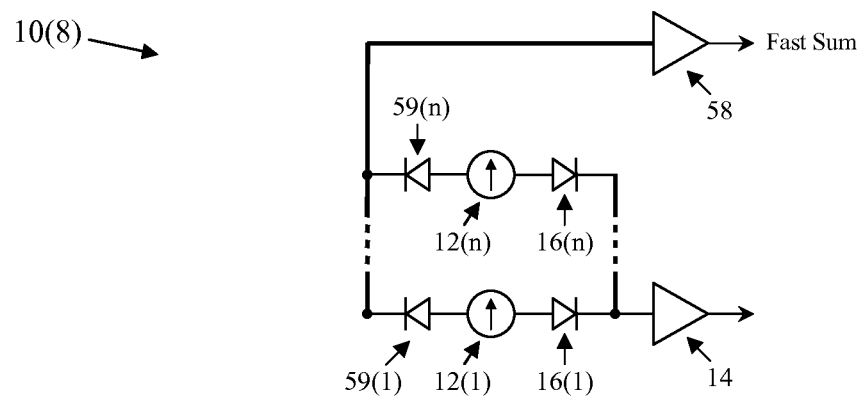
FIG. 6B is a circuit diagram of an exemplary enhanced amplifier circuit with a plurality of current sources and a plurality of diodes with a dedicated fast-sum signal path.

Referring to FIG. 6B exemplary enhanced amplifier circuit 10(8) includes an enhanced amplifier circuit as shown in FIG. 2 with current sources 12(1)-12(n) further coupled to amplifier 58 through a dedicated fast-sum signal path. In this example, amplifier 58 is a fast current amplifier, although other types of amplifiers may be utilized. Current sources 12(1)-12(n) are coupled to the amplifier 58 through diodes 59(1)-59(n), respectively. Diodes 59(1)-59(n) may be any type of diodes known in the art suitable for providing the functions described herein, although other types and numbers of devices or other components could be used, such as a transistor. The diodes 59(1)-59(n) may further be selected for certain properties intrinsic to diodes, such as capacitance, inductance, and nonlinear resistance, although the selected diodes may have other intrinsic properties.

An exemplary operation of the enhanced amplifier circuit 10(8) will now be described. The operation of enhanced amplifier circuit 10(8) is the same as described with respect to exemplary enhanced amplifier circuit 10(2) except as described below. Current sources 12(1)-12(n) produce a fast-sum signal. The fast-sum signal may originate from a fast-timing connection to a standard current source terminal of current sources 12(1)-12(n), although the fast-sum signal may also originate from a dedicated fast-timing current source terminal. The fast-sum signal or current flow from the current sources 12(1)-12(n) is then directed toward the amplifier 48 through the one or more diodes 59(1)-59(2), respectively. Diodes 59(1)-59(n) provide the same operation as described with respect to the diodes of the other exemplary circuits described herein.

The fast-sum signal is then delivered from each of the current sources 12(1)-12(n) to the amplifier 58 which increases the strength of the signal. The signal from amplifier 58 is output for further signal processing. In one example, the fast-sum signal can be used to provide a fast system trigger, although the fast-sum signal may have other applications.

Figure 6C:
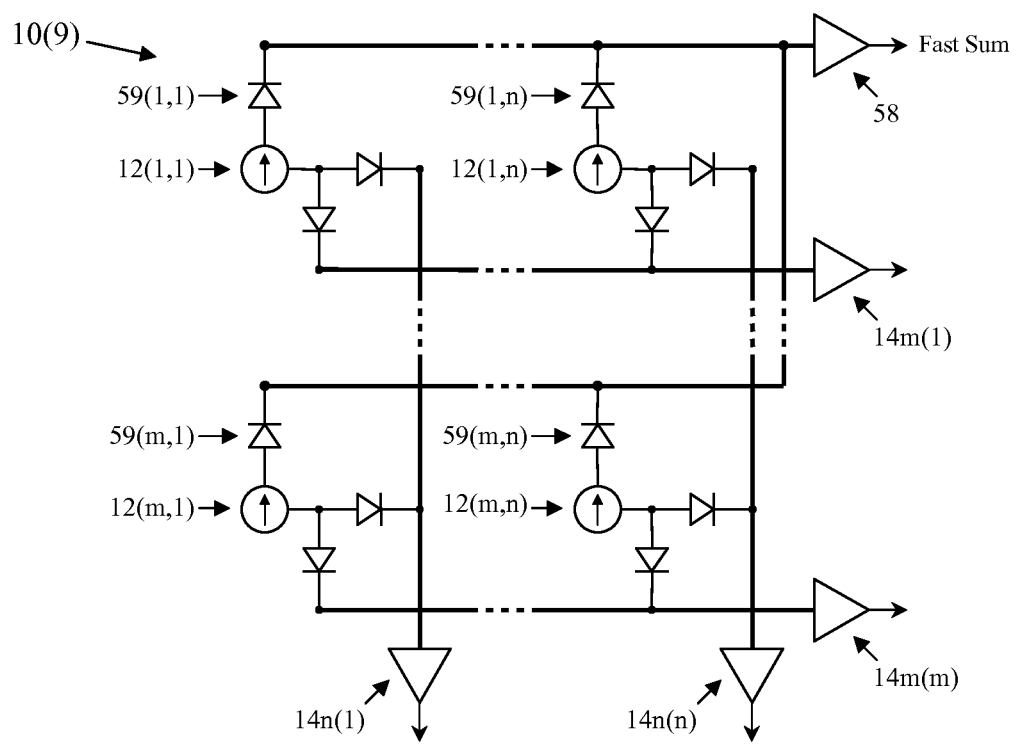
FIG. 6C is a circuit diagram of an exemplary enhanced amplifier circuit with a plurality of current sources and a plurality of diodes arranged in a grid pattern with a dedicated fast-sum signal path.

Referring to FIG. 6C exemplary enhanced amplifier circuit 10(9) includes an enhanced amplifier circuit as shown in FIG. 3 plurality of current sources 12(1,1)-12(m,n) arranged in a grid with rows (m) and columns (n) further coupled to amplifier 58 through a dedicated fast-sum signal path. In this example, amplifier 58 is a fast current amplifier, although other types of amplifiers may be utilized. Current sources 12(1,1)-12(m,n) are coupled to the amplifier 58 through diodes 59(1,1)-59(m,n), respectively. Diodes 59(1,1)-59(m,n) may be any type of diodes known in the art suitable for providing the functions described herein, although other types and numbers of devices or other components could be used, such as a transistor. The diodes 59(1,1)-59(m,n) may further be selected for certain properties intrinsic to diodes, such as capacitance, inductance, and nonlinear resistance, although the selected diodes may have other intrinsic properties.

An exemplary operation of the enhanced amplifier circuit 10(9) will now be described. The operation of enhanced amplifier circuit 10(9) is the same as described with respect to exemplary enhanced amplifier circuit 10(3) except as described below. Current sources 12(1,1)-12(m,n) produce a fast-sum signal. The fast-sum signal may originate from a fast-timing connection to a standard current source terminal of current sources 12(1,1)-12(m,n), although the fast-sum signal may also originate from a dedicated fast-timing current source terminal. The fast-sum signal or current flow from the current sources 12(1,1)-12(m,n) is then directed toward the amplifier 48 through the one or more diodes 59(1,1)-59(m,n), respectively. Diodes 59(1,1)-59(m,n) provide the same operation as described with respect to the diodes of the other exemplary circuits described herein.

The fast-sum signal is then delivered from each of the current sources 12(1,1)-12(m,n) to the amplifier 58 which increases the strength of the signal. The signal from amplifier 58 is output for further signal processing. In one example, the fast-sum signal can be used to provide a fast system trigger, although the fast-sum signal may have other applications.

Accordingly, as illustrated and described by way of the examples herein, this technology provides a number of advantages including providing more effective enhanced amplifier circuits and methods of manufacture. With this technology, the amplifier is prevented from interacting with undesired properties of the current source, such as capacitance and resistance. Additionally, with this technology current sources are prevented from interacting with each other. Further, with this technology the intrinsic properties of the diode are used to modify the current source output signal. The benefits of this technology may be further applied to groups of current sources connected to a single amplifier, as well as a grid of current sources with row and column amplifiers. The technology also reduces performance degradation and simplifies the application circuit and amplifier design process.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. An enhanced amplifier circuit comprising:
   at least one amplifier having at least an input and an output;
   a plurality of current sources; and
   a plurality of diodes, wherein each of the plurality of diodes is coupled between at least one of the plurality of current sources and the input of the at least one amplifier.

2. The circuit of claim 1 wherein an anode of each of the plurality of diodes is coupled to one of the plurality of current sources and a cathode of each of the plurality of diodes is coupled to the input of the at least one amplifier.

3. The circuit of claim 1 wherein a cathode of each of the plurality of diodes is coupled to one of the plurality of current sources and an anode of each of the plurality of diodes is coupled to the input of the at least one amplifier.

4. The circuit of claim 1 wherein the plurality of current sources are sensors.

5. The circuit of claim 1 wherein the at least one amplifier is a current-to-voltage converter.

6. The circuit of claim 1 wherein the at least one amplifier further comprises a plurality of amplifiers, each of the plurality of diodes is coupled between at least one of the plurality of current sources and the input of at least one of the plurality of amplifiers.

7. The circuit of claim 6 wherein the plurality of current sources are arranged in a grid comprising a plurality of rows and a plurality of columns wherein each row of current sources in the plurality of current sources is associated with a row amplifier and each column of current sources in the plurality of current sources is associated with a column amplifier.

8. The circuit of claim 1 wherein the plurality of diodes and at least one amplifier function as a signal processor.

9. The circuit of claim 1 further comprising one or more resistors, wherein the one or more resistors are located in series with the plurality of diodes.

10. The circuit of claim 1 further comprising one or more inductors, wherein the one or more inductors are located in series with the plurality of diodes.

11. The circuit of claim 1 further comprising one or more capacitors, wherein the one or more capacitors are located in series with the plurality of diodes.

12. The circuit of claim 1 further comprising at least one switch or transistor in series with the plurality of diodes to selectively disconnect the plurality of current sources from the at least one amplifier.

13. The circuit of claim 1 further comprising at least one switch or transistor in parallel with the plurality of diodes to selectively bypass the plurality of diodes.

14. The circuit of claim 1 further comprising an external voltage or current source to change the operation of the plurality of diodes or the plurality of current sources.

15. A method for providing a diode enhanced amplifier circuit, the method comprising:
   providing at least one amplifier having at least an input and an output;
   providing a plurality of current sources; and
   coupling each of a plurality of diodes between at least one of the plurality of current sources and the input of the at least one amplifier.

16. The method of claim 15 wherein the coupling further comprises coupling an anode of each of the plurality of diodes to the at least one of the plurality of current sources and a cathode of each of the plurality of diodes to the input of the at least one amplifier.

17. The method of claim 15 wherein the coupling further comprises coupling a cathode of each of the plurality of diodes to the at least one of the plurality of current sources and an anode of each of the plurality of diodes to the input of the at least one amplifier.

18. The method of claim 15 wherein the plurality of current sources are sensors.

19. The method of claim 15 wherein the at least one amplifier is a current-to-voltage converter.

20. The method of claim 15 wherein the providing the at least one amplifier further comprises providing a plurality of amplifiers and the coupling each of the plurality of diodes further comprises coupling each of the plurality of diodes between at least one of the plurality of current sources and the input of at least one of the plurality of amplifiers.

21. The method of claim 20 wherein the plurality of current sources are arranged in a grid comprising a plurality of rows and a plurality of columns wherein each row of current sources in the plurality of current sources is associated with a row amplifier and each column of current sources in the plurality of current sources is associated with a column amplifier.

22. The method of claim 15 wherein the plurality of diodes and at least one amplifier function as a signal processor.

23. The method of claim 15 further comprising providing one or more resistors located in series with the plurality of diodes.

24. The method of claim 15 further comprising providing one or more capacitors in series with the plurality of diodes.

25. The method of claim 15 further comprising providing one or more inductors in series with the plurality of diodes.

26. The method of claim 15 further comprising providing at least one switch or transistor in series with the plurality of diodes to selectively disconnect the plurality of current sources from the at least one amplifier.

27. The method of claim 15 further comprising providing at least one switch or transistor in parallel with the plurality of diodes to selectively bypass the plurality of diodes.

28. The method of claim 15 further comprising providing an external voltage or current source to change the operation of the plurality of diodes or the plurality of current sources.

* * * * *